(12) United States Patent
Makaram et al.

(10) Patent No.: US 11,908,763 B2
(45) Date of Patent: *Feb. 20, 2024

(54) APPARATUS HAVING A FUNCTIONAL STRUCTURE DELIMITED BY A FRAME STRUCTURE AND METHOD FOR PRODUCING SAME

(71) Applicant: Infineon Technologies AG, Neubiberg (DE)

(72) Inventors: Prashanth Makaram, Berlin (DE); John Cooper, Villach (AT); Joerg Ortner, Drobollach (AT); Stephan Pindl, Ergoldsbach (DE); Caterina Travan, Munich (DE); Alexander Zoepfl, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 58 days.

This patent is subject to a terminal disclaimer.

(21) Appl. No.: 17/483,312

(22) Filed: Sep. 23, 2021

(65) Prior Publication Data
US 2022/0013424 A1 Jan. 13, 2022

Related U.S. Application Data

(62) Division of application No. 16/433,278, filed on Jun. 6, 2019, now Pat. No. 11,189,539.

(30) Foreign Application Priority Data

Jun. 7, 2018 (DE) .......................... 102018209024.6

(51) Int. Cl.
*H01L 23/31* (2006.01)
*H01L 21/02* (2006.01)

(52) U.S. Cl.
CPC .... *H01L 23/3171* (2013.01); *H01L 21/02282* (2013.01); *H01L 23/3178* (2013.01)

(58) Field of Classification Search
CPC .......... H01L 21/02282; H01L 23/3171; H01L 23/3178; H01L 41/00; B81B 3/0018
(Continued)

(56) References Cited

U.S. PATENT DOCUMENTS

2004/0126920 A1 7/2004 An et al.
2006/0113510 A1 6/2006 Luo et al.
(Continued)

FOREIGN PATENT DOCUMENTS

CN 102193680 A 9/2011
CN 107017207 A 8/2017
(Continued)

OTHER PUBLICATIONS

Zeng, Xuefeng et al., "Liquid tunable microlenses based on MEMS techniques," Journal of Physics D: Applied Physics, 46, 323001, doi: 10.1088/0022-3727/46/32/323001, filed Jul. 17, 2013, 22 pages.

*Primary Examiner* — Matthew E. Gordon
(74) *Attorney, Agent, or Firm* — Slater Matsil, LLP

(57) ABSTRACT

An apparatus includes a semiconductor-based substrate with a functional structure that is formed in or on the semiconductor-based substrate. The apparatus includes a frame structure surrounding the functional structure and includes a coating that covers the functional structure and is delimited by the frame structure.

20 Claims, 12 Drawing Sheets

(58) Field of Classification Search
USPC .......................................................... 257/414
See application file for complete search history.

(56) References Cited

U.S. PATENT DOCUMENTS

| | | |
|---|---|---|
| 2007/0001591 A1 | 1/2007 | Tanaka |
| 2007/0161139 A1 | 7/2007 | Loeppert |
| 2008/0280038 A1* | 11/2008 | Ward .................... D01F 9/1272 427/249.17 |
| 2009/0272999 A1 | 11/2009 | Yoshida et al. |
| 2009/0289313 A1 | 11/2009 | Yamazaki |
| 2011/0227867 A1 | 9/2011 | Ogawa et al. |
| 2012/0247217 A1* | 10/2012 | Suzuki .................... G01L 11/06 29/25.35 |
| 2014/0182390 A1 | 7/2014 | Pagani et al. |
| 2015/0270485 A1 | 9/2015 | Watanabe |

FOREIGN PATENT DOCUMENTS

| | | |
|---|---|---|
| DE | 112005000218 T5 | 11/2007 |
| DE | 102007027127 A1 | 12/2007 |
| DE | 102007031428 A1 | 12/2008 |
| KR | 20090028650 A | 3/2009 |
| KR | 20160031633 A | 3/2016 |

* cited by examiner

APPARATUS HAVING A FUNCTIONAL STRUCTURE DELIMITED BY A FRAME STRUCTURE AND METHOD FOR PRODUCING SAME

This application is a divisional of U.S. patent application Ser. No. 16/433,278, filed Jun. 6, 2019, which application claims the benefit of German Application No. 102018209024.6, filed on Jun. 7, 2018, which applications are hereby incorporated herein by reference.

TECHNICAL FIELD

The present disclosure relates to an apparatus having a coating of a functional structure delimited by a frame structure and to a method for producing same. The present disclosure furthermore relates to a frame-type structure for uniformly arranging thin films made of nanomaterials.

BACKGROUND

Semiconductor-based apparatuses, such as sensors and/or actuators, can have a multi-layer construction. Some of the layers of the layer construction can be semiconductor-based layers, for example in the form of wafers and/or epitaxially grown layers. Other layers can be applied by a suitable process for the arrangement, for example by way of gas phase deposition, printing processes or mechanical placement or positioning methods.

Apparatuses in which arranged layers having a high degree of precision and a high degree of uniformity are obtained would be desirable.

SUMMARY

Exemplary embodiments provide an apparatus having a semiconductor-based substrate with a functional structure that is formed in or on the semiconductor-based substrate. The apparatus comprises a frame structure surrounding the functional structure. The apparatus furthermore comprises a coating that covers the functional structure and is delimited by the frame structure.

A further exemplary embodiment provides a method for producing a structure. The method comprises providing a semiconductor-based substrate having a functional structure that is arranged in or on the semiconductor-based substrate. The method comprises arranging a frame structure such that the frame structure surrounds the functional structure. The method comprises arranging a coating such that the coating covers the functional structure and is delimited by the frame structure.

Further exemplary embodiments are defined in the dependent patent claims.

BRIEF DESCRIPTION OF THE DRAWINGS

Exemplary embodiments will be explained below with reference to the appended drawings. In the figures.

DETAILED DESCRIPTION OF ILLUSTRATIVE EMBODIMENTS

Before exemplary embodiments are explained in more detail below with reference to the drawings, it should be noted that identical, functionally equivalent or identically acting elements, objects and/or structures are denoted in the various figures with the same reference signs, which means that the description of said elements illustrated in the various exemplary embodiments is interchangeable or can be applied to one another.

The following exemplary embodiments relate to an apparatus having a functional structure. The functional structure can be an element which is deflectable by way of an actuator and/or sensor, such as a membrane structure, a post structure, a beam structure or the like. Alternatively or additionally, the functional structure can also be immovable and be embodied for example such that, based on an interaction with physical, chemical or other variables to be sensed, it changes a property that is then determinable. Examples of such structures are for example fluid sensors, in particular chemosensors, which can change an electric property, such as a resistance value, based on an interaction or adsorption of a material from the fluid in a sensor environment. One example of a chemosensor within the meaning of the present disclosure is a gas sensor. In accordance with an exemplary embodiment, the functional structure comprises an electrode structure having one or more electrodes and/or conductor tracks. In other words, any desired portion of a structure formed during a technology process is understood to be a functional structure.

The following exemplary embodiments furthermore relate to a coating covering the functional structure. Functional structures in accordance with exemplary embodiments described here can be arranged both for functionalization and, alternatively or additionally, as mechanical protection. Functionalization can be attained for example by way of an electrical conductivity of the coating, which provides an electrically conductive function of the coating.

Alternatively or additionally, touch protection, dust protection or the like can be provided by virtue of the coating covering the functional structure. In accordance with exemplary embodiments, it is alternatively or additionally possible to provide protection against chemical influences, for example by facilitating or preventing interaction with a medium by way of the functional structure.

Figure 1:
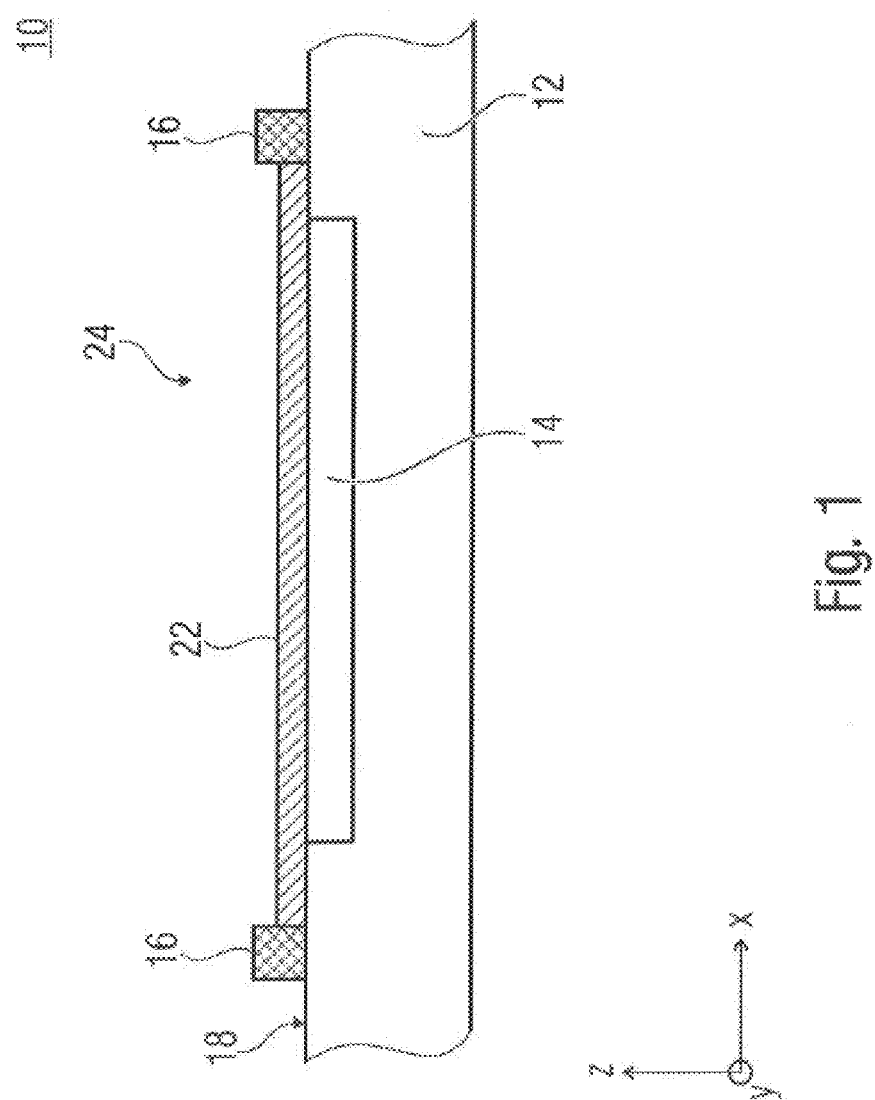
FIG. 1 shows a schematic side sectional view of an apparatus according to an exemplary embodiment.

FIG. 1 shows a schematic side sectional view of an apparatus 10 according to an exemplary embodiment. The apparatus 10 comprises a semiconductor-based substrate, for example comprising a silicon material, gallium arsenide material, and/or another semiconductor material. The semiconductor-based substrate 12 can be present for example in the form of a wafer, for example before singulation into individual sensors, actuators or chips, but can also be present in already singulated form. The semiconductor-based substrate 12 can comprise a plurality of layers in different and/or combined sub-layers of the semiconductor-based substrate 12, for example silicon or polysilicon layers, which can be covered entirely or partially by insulating materials, such as silicon oxide. Alternatively or additionally, other or further materials can be arranged, such as silicon nitride materials.

The apparatus 10 comprises a functional structure 14 that is introduced for example in and/or on the semiconductor-based substrate 12 and forms a common surface with the semiconductor-based substrate 12. The functional structure 14 can be any desired sensor device and/or actuator device. Alternatively or additionally, the functional structure 14 can also be a circuit arrangement comprising any desired number of conductor tracks and/or circuit components. The functional structure can comprise one or more electrodes, wherein said electrodes can be arranged on or under the substrate surface, for example as buried electrodes or as electrodes which are arranged under the substrate surface but are freely accessible.

The apparatus 10 comprises a frame structure 16 surrounding the functional structure 14. The frame structure 16 can be arranged on the surface 18 of the semiconductor substrate 12; for example, the surface 18 is the surface that forms the common surface with the functional structure 14. Alternatively, the frame structure 16 can also be arranged in any other plane. The frame structure 16 can be arranged such that, at least in the case of a projection of the functional structure 14 and of the frame structure 16 into the surface 18 of the semiconductor-based substrate 12, that is to say into a common plane, the functional structure 14 is arranged within the frame structure 16. This can be achieved by virtue of the frame structure 16 continuously and/or completely enclosing the functional structure 14. Alternatively, the frame structure 16 can also have openings such that the frame structure surrounds the functional structure 14 merely incompletely. Although the frame structure 16 is described such that the functional structure 14 is enclosed, this does not rule out that one or more electrical contact locations or supply lines of the functional structure 14 are located in a region of the frame structure 16, for example under the frame structure, over the frame structure, or form a layer of the frame structure.

The apparatus 10 comprises a coating 22 that covers the functional structure 14 and is delimited by the frame structure 16. The coating 22 can here cover the functional structure 14 partially or completely. The coating 22 can completely cover a region 24 that is completely or incompletely enclosed by the frame structure 16. On account of the use of the frame structure 16, the arrangement of the coating 22 can be such that the coating 22 can be arranged with a high degree of precision with respect to a lateral position of the coating 22 along directions x and/or y parallel to the surface 18. Alternatively or additionally, the coating 22 can also be attained with a high degree of precision with respect to a layer thickness, but for example not necessarily parallel to the z-direction, which can also be understood to be the thickness direction. Alternatively or additionally, it is possible to obtain a high degree of uniformity of the coating 22, specifically on the functional structure 14. For example, the frame structure 16 may be suitable for printing and/or dispensing processes, in which a liquid, such as an ink material or the like, is applied over the functional structure 14. The definition of the region 24 by way of the frame structure 16 makes possible the arrangement of the liquid within the region 24 and uniform drying in the region 24. For example what are known as coffee rings, which can be obtained through non-uniform drying, on the functional structure 14 can thus be avoided.

Figure 2:
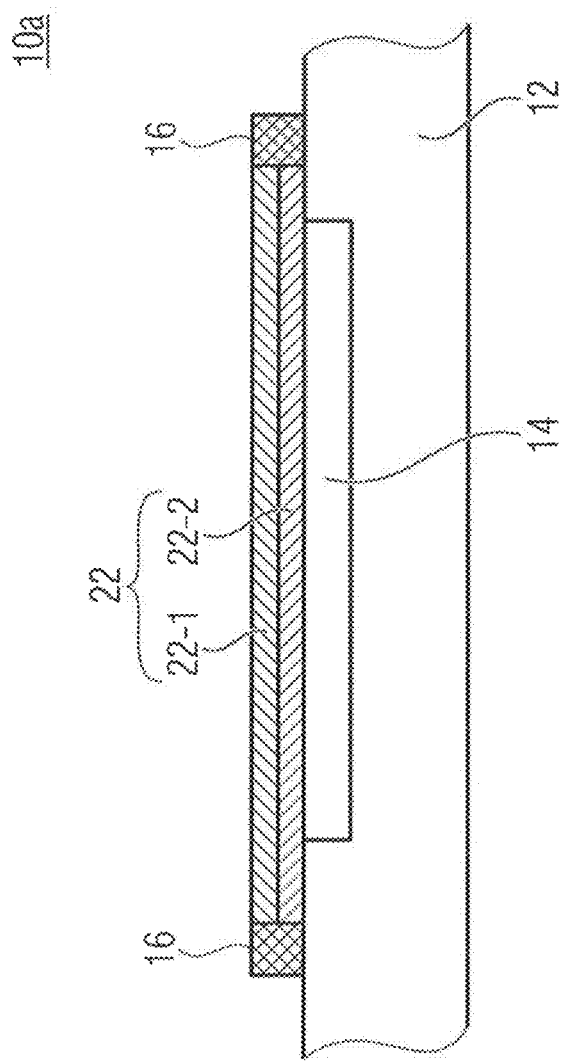
FIG. 2 shows a schematic side sectional view of an apparatus according to an exemplary embodiment, in which a coating includes a first layer and a second layer.

FIG. 2 shows a schematic side sectional view of an apparatus boa, in which the coating 22 has a first layer 22-1 and a second layer 22-2, wherein alternatively or additionally merely one layer or more than two layers can be arranged, for example three or more, five or more, ten or more, or a greater number. Each of the layers can be arranged independently of other layers over the entire region of the frame structure 16 or merely in partial regions, as long as the frame structure 16 is formed in this way. For example, when combining a first, possibly electronically insulating, layer with a second, possibly electrically conductive, layer, the second layer may be arranged merely in partial regions of the frame structure 16, and the first layer may be arranged contiguously, for example. This makes it possible for different portions to be formed to be electrically insulating and electrically conductive into the frame structure 16, with different materials being able to be used herein, for example a silicon material, such as polysilicon, silicon oxide and/or silicon nitride.

The layers 22-1 and 22-2 can have the same or different materials. For example, the layers 22-1 and/or 22-2 can comprise a nanomaterial, for example a carbon nanomaterial. One example of a carbon nanomaterial is graphene. Alternatively or additionally, it is possible for one or more other 2D nanomaterials, polymer materials, metal and/or metal oxide nanoparticles, and any desired material combinations or composite materials from the previously mentioned materials to be arranged. For example, a multilayer coating can be obtained by way of multi-step printing.

An identical or comparable height of the frame structure 16 and of the coating 22 can be obtained for example by performing an etching process, a polishing process, or a grinding process. The apparatus 10 in FIG. 1 can represent for example a state before such a grinding process. Alternatively, it is also possible to arrange an amount of coating materials such that a corresponding height is obtained after receiving the coating 22, for example by drying.

Figure 3:
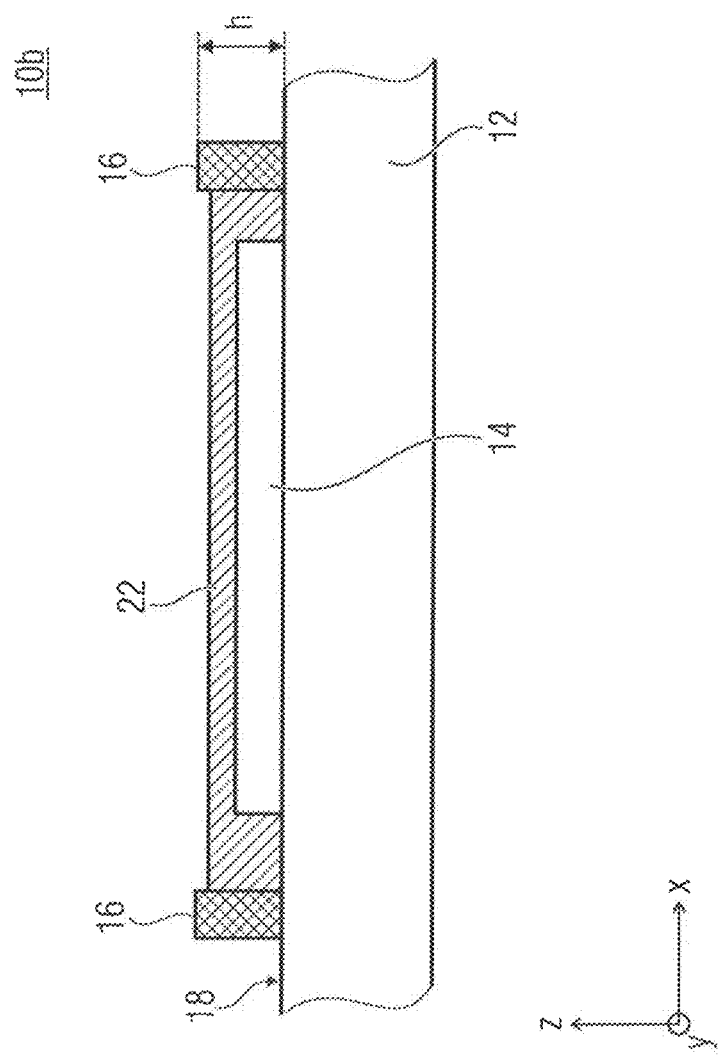
FIG. 3 shows a schematic side sectional view of an apparatus according to an exemplary embodiment, in which a functional structure regionally protrudes with respect to the semiconductor-based substrate.

FIG. 3 shows a schematic side sectional view of an apparatus 10b, in which the functional structure 14 is arranged on the semiconductor-based substrate 12, for example on the surface 18. For example, these can be regions or layers which are grown on, arranged or not removed and make it possible that the functional structure 14 regionally protrudes with respect to the semiconductor-based substrate 12. The coating 22 can nevertheless cover the functional structure 14. A distance between the functional structure 14 and the frame structure 16 makes possible the covering of the functional structure 14 with the coating 22 even on side surfaces of the functional structure 14.

As shown in FIG. 1 and FIG. 2, the functional structure 14 arranged on the semiconductor-based substrate 12 according to FIG. 3 can also make possible partial or even complete encapsulation of the functional structure 14 by the semiconductor-based substrate 12 and the coating 22.

As shown in FIG. 1, FIG. 2 and FIG. 3, the frame structure can be arranged on the substrate side, for example the substrate surface 18, and protrude with respect to the substrate surface. It should be pointed out that the substrate side can certainly be understood to be the surface 18, but it can also be another substrate surface, and/or the frame structure can also cover other parts of the apparatus, for example circuit parts or the like. A dimension or height h of the frame structure 16 parallel to the thickness direction z, which extends for example parallel to a surface normal of the surface 18, can be at least 10 nm and at most 1000 μm, at least 50 nm and at most 800 μm, or at least 100 nm and at most 1 μm.

Figure 4:
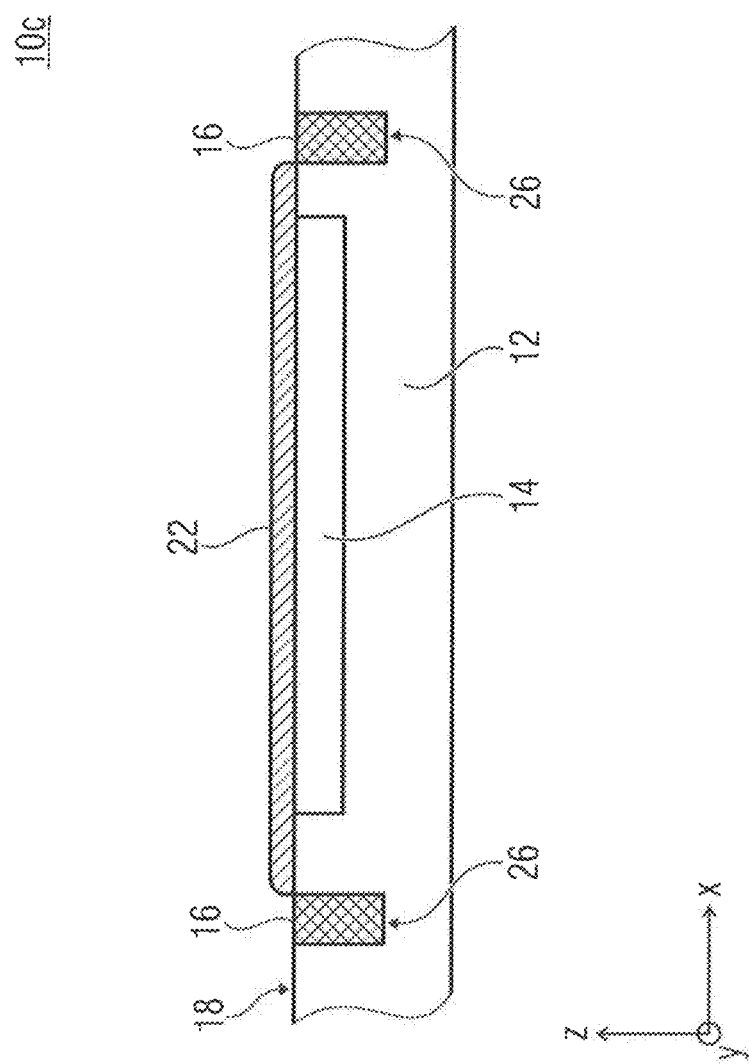
FIG. 4 shows a schematic side sectional view of an apparatus according to an exemplary embodiment, in which a frame structure at least partially fills one or more recesses in the semiconductor-based substrate.

FIG. 4 shows a schematic side sectional view of an apparatus 10c according to an exemplary embodiment, in which the frame structure 16 at least partially fills one or more recesses 26 in the semiconductor-based substrate 12, such that a material of the frame structure 16 may approach the surface 18 or is at least applied very thinly, that is to say has a layer thickness of less than 10 nm, for example. This makes it possible that, when depositing a material of the coating 22, a repelling force between the material of the coating 22 and the material of the frame structure 16 prevents an overflow of material of the coating 22 over the frame structure 16, for example due to surface forces that may arise when using liquids. In particular in printing methods for depositing an ink or dispersion comprising the coating material of the coating and a solvent, the applied ink can be delimited by such surface forces in terms of its spatial extent/distribution, that is to say the spread thereof can be confined. Such a surface effect can be advantageously utilized in other exemplary embodiments, too, for example in the apparatus 10, 10a and/or 10b with respect to the materials of the frame structure and of the coating 22.

A maximally attainable layer thickness of the ink and consequently of the coating 22 can be influenced based on an amplitude or strength of such surface forces. The amplitude of the surface forces can be influenced for example by a suitable material selection and/or by way of dimensions of the frame structure, for example a frame width, which in FIG. 4 can be understood to be a dimension of the frame structure 16 along the x-direction. For example, the functional structure 14 can also partially project beyond the surface 18 of the semiconductor-based substrate 12 and still be completely covered by the coating 22. Such a delimiting property of the frame structure 16 can also be utilized in accordance with the other frame structures described here, but in this case a height or depth of the frame structure may already offer sufficient delimitation security.

The coating 22, or the material applied for arranging the coating 22, and a material of the frame structure 16 can exhibit for example opposite or repelling properties, for example can be formed in complementary fashion with respect to a hydrophobic property and a hydrophilic property. In accordance with an exemplary embodiment, the coating 22 comprises a hydrophilic coating material. The frame structure 16 can comprise a hydrophobic material. The frame structure 16 can comprise a structurable material. This includes for example a polymer material, such as polyimide. Alternatively or additionally, the structurable material can comprise other materials, for example a photoresist, such as SU-8, polymethyl methacrylate (PMMA), silicon oxide (SiO$_2$), silicon nitride (SiN) and/or a combination thereof. The frame structure can be embodied for example by performing at least one step during or at the end of a photo lithographic method for producing the apparatus 10, 10a, 10b and/or 10c.

Alternatively, a complementary embodiment can also be effected by way of the coating 22 comprising a hydrophobic coating material and the frame structure 16 comprising a hydrophilic material.

Hydrophobic coating material can be easily soluble or suspendable in a hydrophobic solvent. In the same way, hydrophilic coating material can be easily soluble or suspendable in a hydrophilic solvent. There are also possibilities for dissolving or suspending a hydrophobic material of the coating 22 such that a hydrophilic material mix that is easily combinable with a hydrophobic material of the frame structure 16 yet brings about identical material properties of the coating 22 and of the frame structure 16 in the dried state of the coating 22 is obtained.

Unlike in FIG. 1, FIG. 2 and FIG. 3, the frame structure 16 has, for example, a dimension h of 0, wherein the frame structure 16 can alternatively also protrude with respect to the surface 18.

Figure 5:
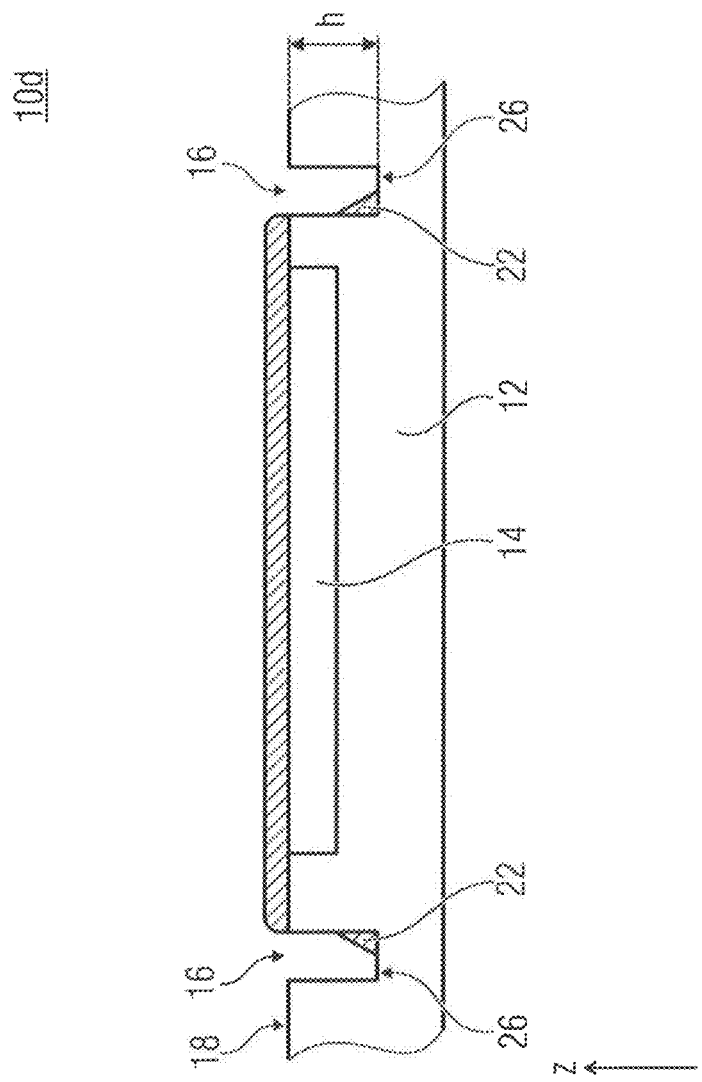
FIG. 5 shows a schematic side sectional view of an apparatus according to an exemplary embodiment, in which the frame structure is at least partially formed by the recesses.

FIG. 5 shows a schematic side sectional view of an apparatus 10d in accordance with an exemplary embodiment, in which the frame structure 16 is at least partially formed by the depressions 26, which means that the frame structure 16 forms a trench in the substrate side, for example in a substrate surface 18. This allows the medium used for arranging the coating 22 to flow off or over into the depressions 26, which means that the coating 22 can also be partially located in the depressions 26.

The depression 26 can also partially be filled with a material for forming the frame structure 16, which can also correspond to a merely partial recess 26 in FIG. 4 that is filled with the material of the frame structure 16. A depth of the depressions 26 can likewise be understood to be the dimension h and have the same dimensions. Starting from the surface 18, it is possible for merely the direction along the z-direction to be swapped around if the frame structure according to FIG. 4 or 5 is compared to the frame structures according to FIG. 1, FIG. 2 and/or FIG. 3.

Figure 6:
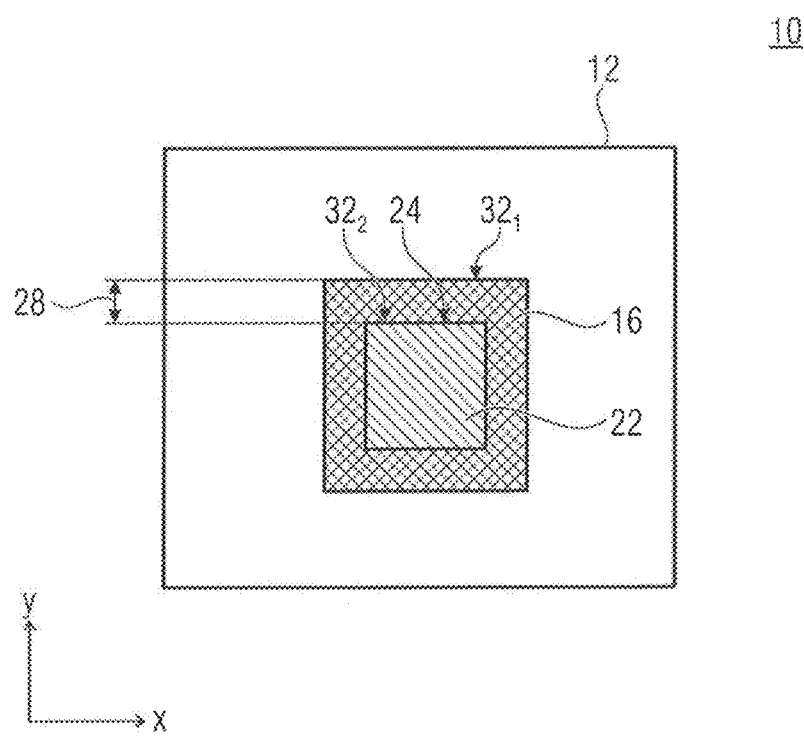
FIG. 6 shows a schematic plan view of the apparatus in FIG. 1.

FIG. 6 shows a schematic plan view of the apparatus 10, wherein the statements are also valid for other ones of the apparatuses described here, for example the apparatus 10a, 10b, 10c and/or 10d. The frame structure 16 encloses the region 24 as a surrounding structure, for example as a depression, as a filled depression, and/or as a protrusion with respect to a corresponding surface of the semiconductor-based substrate 12. The coating 22 can be homogeneous in the region 24, which means it can have a low surface waviness and/or identical, continuous materials. The arrangement of the frame structure 16 makes possible the arrangement of the material of the coating 22 in the region 24 and spreading of the material in the region 24. A subsequent hardening, strengthening and/or drying process can permit homogeneous drying of the material of the coating 22, with the result that the coating 22 is obtained with a hardly disturbing or non-disturbing artefact or even with the avoidance of disturbing artefacts such as coffee rings. It is thus possible, for example, for an artefact, for example a coffee ring artefact, to form despite the frame structure 16. By way of positioning the frame structure 16 such that the frame structure 16 encloses the functional structure 14 and there is possibly a distance between the functional structure 14 and the frame structure 16 in the case of a projection into the common plane, the formation of the artefact can be controlled or moved into a region of the frame structure and/or of said distance. Here, the artefact does not disturb or negligibly disturbs the function of the apparatus because the coating is obtained uniformly in the region of the functional structure 14. In other words: Should disturbing artefacts such as coffee rings nevertheless arise, they can be located either on and/or at the inner periphery of the frame structure 16, but not on the functional structure, which is uniformly covered with a coating 22.

Based on different tasks of the frame structure 16 during the receiving of the coating 22, a frame width 28 can be at least 10 nm and at most 10 mm, at least 50 nm and at most 5 mm, or at least 100 nm and at most 1 mm. The frame width can be understood to be the shortest connection between an outer side 321 and an inner side 322 of the frame structure 16, wherein the inner side 322 can be understood to be the side of the frame structure 16 that faces the coating 22, and the outer side 321 can be understood to be the side of the frame structure 16 that faces away from the coating 22. A varying dimension 28 can result in different properties with respect to thermal capacitance, hydrophilicity and/or hydrophobicity, such that the properties obtained are settable based on the frame width 28.

Figure 7:
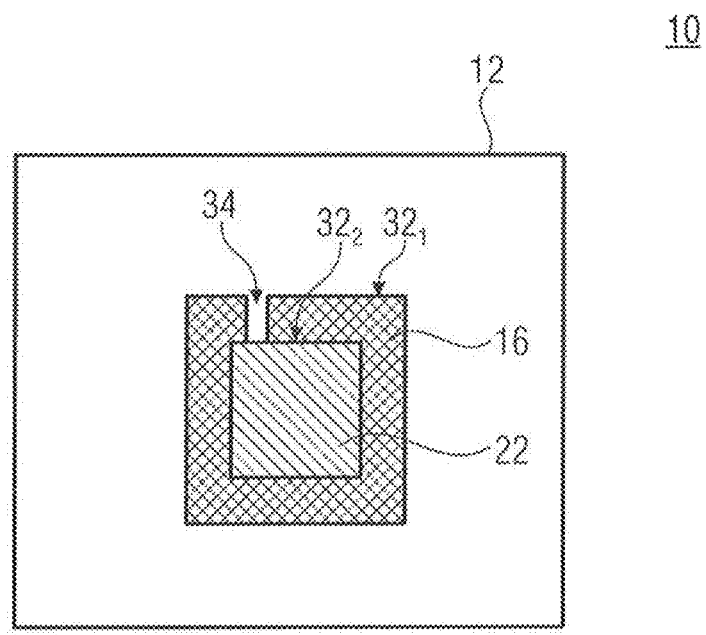
FIG. 7 shows a schematic plan view of the apparatus in FIG. 1 according to an exemplary embodiment, in which the frame structure has an opening.

FIG. 7 shows a schematic plan view of the apparatus 10 according to an exemplary embodiment, in which the frame structure 16 has an opening 34 connecting the outer side 321 to the inner side 322. Alternatively, the apparatus 10 can also have more than one opening 34 in the frame structure 16, or, as is illustrated for example in FIG. 6, no opening. The opening 34 makes possible an arrangement of other elements in the cut-out region and/or any desired utilization of said region. The opening 34 can be formed here such that it is small enough to still prevent the material of the coating 22 from flowing through it during the manufacturing process. Providing a plurality of openings 34 thus makes possible for example the arrangement or production of the frame structure 16 with little material outlay and/or with low material stress acting on the semiconductor substrate 12 during cooling.

In addition to delimiting the coating 22, the frame structure 16 can also be formed to be electrically conductive, in particular with respect to the apparatuses 10, 10a, 10b and/or 10c. This makes possible further functionalization of the frame structure 16, for example by at least partially substituting further or other conductor tracks therewith.

A frame structure 16 that is formed from provided or arranged material, as described for example in connection with FIG. 1, FIG. 2, FIG. 3 and/or FIG. 4, can comprise one material layer, but can also be embodied in multilayer form, which likewise makes possible a greater degree of functionalization. Different layers can have different properties that are able to be adapted to one another with respect to electrical conductivity, thermal conductivity, hydrophobicity and/or hydrophilicity.

Figure 8:
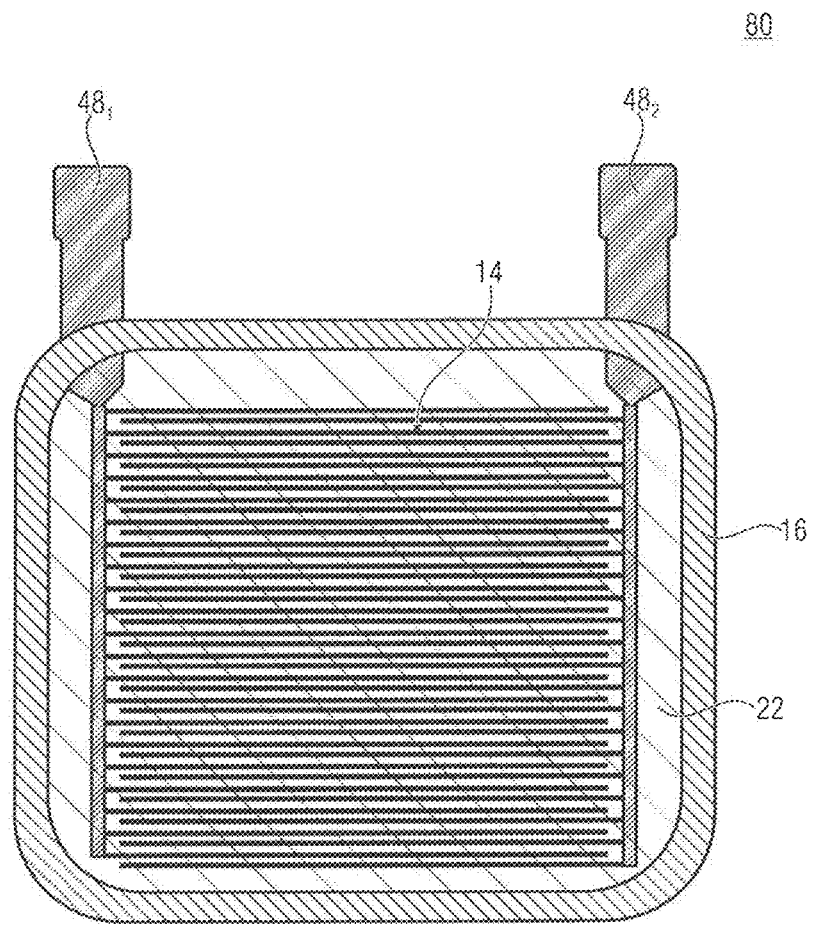
FIG. 8 shows a schematic plan view of an apparatus according to an exemplary embodiment, in which the functional structure comprises interdigital electrodes.

FIG. 8 shows a schematic plan view of an apparatus 80 according to an exemplary embodiment, in which the functional structure 14 comprises interdigital electrodes that are surrounded or enclosed by the frame structure 16 and are able to be contacted via outer, possibly uncoated, electrodes 481 and 482.

Figure 9A:
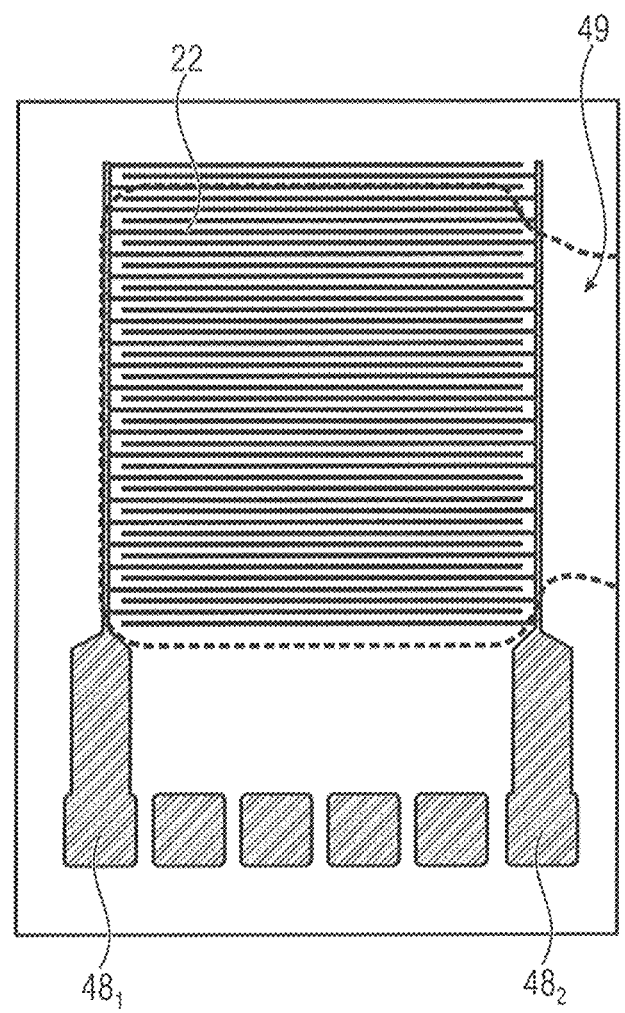
FIG. 9a shows a schematic plan view of a known apparatus comprising a structure of interdigital electrodes.

FIG. 9a shows a plan view of a known apparatus comprising a structure of interdigital electrodes which are able to be contacted by the electrodes 481 and 482. It serves as a negative example without a frame structure. The coating 22 is formed non-uniformly with the formation of what are known as coffee rings. In addition, the figure shows uncontrolled flowing out of the coating 22 in a region 49.

Figure 9B:
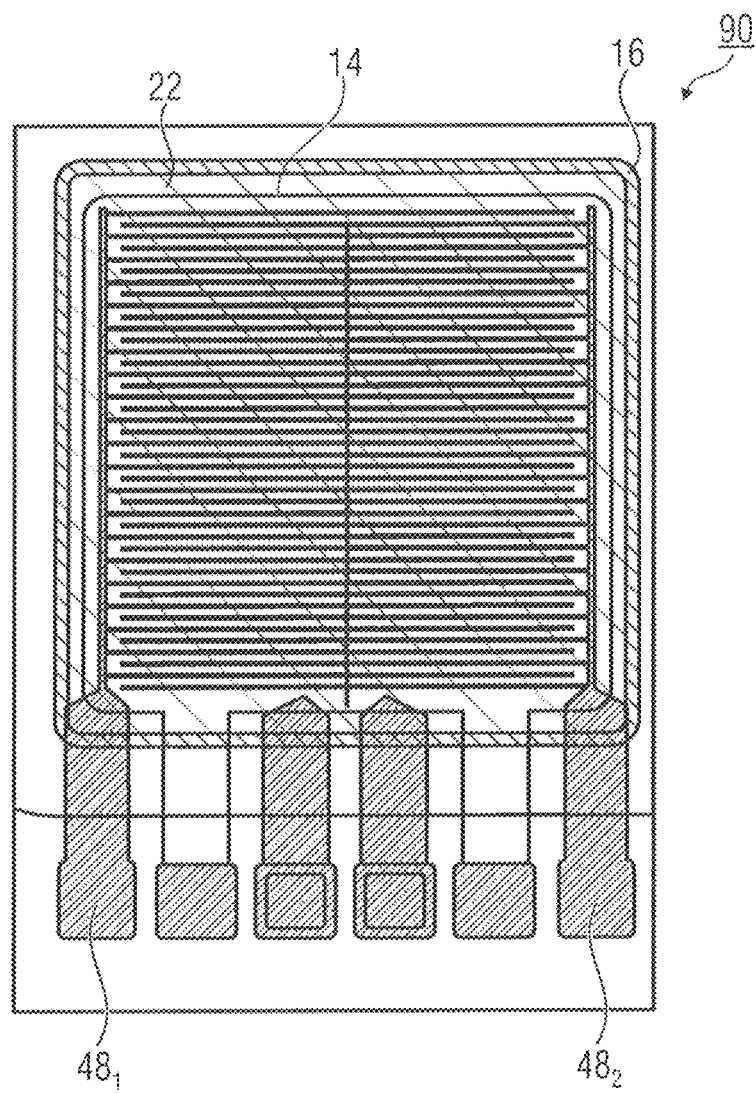
FIG. 9b shows a schematic plan view of an apparatus according to an exemplary embodiment having the same structure as in FIG. 9a, but additionally having the frame structure.

FIG. 9b shows a plan view of an apparatus 90 according to an exemplary embodiment having the same structure as in FIG. 9a, but additionally having the frame structure 16 that encloses the functional structure 14. A homogeneous coating 22 can be achieved in this way.

In other words, FIGS. 9a and 9b demonstrate an implementation in accordance with exemplary embodiments. FIG. 9a shows printing of a carbon nanomaterial ink on a resistive sensor. By using the frame structure, as is illustrated in FIG. 9b, a material aggregation at drying peripheries (coffee ring effect) on the functional structure 14 can be avoided and thus uniform film formation can be accomplished. In FIG. 9b, the frame structure is formed as a polyimide frame and effects an effective coating formation by virtue of the carbon nanomaterial ink being delimited.

Exemplary embodiments thus create transistors or chemosensors, wherein the exemplary embodiments are not limited hereto. Knowledge gained relates to the fact that a frame is formed around the region of interest so as to be able to uniformly deposit nanomaterial thin films here, which results in a high reproducibility of the production process. Exemplary embodiments permit the production of apparatuses for monitoring air quality. Alternative chemosensors with other nanomaterials and composite materials can also be formed. The exemplary embodiments described here furthermore permit printing of thin films, which makes it possible to obtain thin-film apparatuses, such as nanomaterial transistors, nano-material detectors and the like.

Exemplary embodiments make it possible to obtain uniform layers of nanomaterials, in particular by using printing methods, for example inkjet printing methods. Problems such as mismatches between viscosity of the solvent and/or the coffee ring formation, that is to say a material aggregation at the peripheries of the pattern that impair the quality of the apparatuses, in particular by impairing the uniformity of the thin film arranged, can be overcome with the exemplary embodiments described herein.

As opposed to solutions that propose a low viscosity of the solvents, which permits immediate evaporation after application, the resulting disadvantages are overcome, according to which:

1. the provision of the inks based on such solvents is challenging and obtaining a stable dispersant with nanomaterials is difficult.

2. while low-viscosity liquids work well in laboratories, they exhibit low throughput in printing technology. These technologies are hardly scalable. Many of the known production inkjet printers are suitable for the use of viscosities of greater than 8 cP.

3. another approach is the modification of the surface energy of the substrate to stop spreading of the ink and minimize the coffee ring effect, but such pre-treatments mean that the properties of the substrate layer are changed and difficult to monitor, control and/or keep constant over a specific time period.

Exemplary embodiments offer the possibility of easily and reproducibly arranging layers, in particular nanomaterial layers.

Exemplary embodiments relate to the arrangement of a frame-type structure that delimits the spreading of the ink into the previously defined region. The frame structure offers the advantages that:

1. high-viscosity liquids and/or inks having high surface tension can be used;
2. after filling the frame with the ink and slow drying thereof, uniform coverage of the area of the region 24 with the nanomaterial thin-film is obtained. The region 24 has interdigital electrodes, for example;
3. the coffee ring (material aggregation at the periphery of the pattern), which could be produced by drying and can result in inhomogeneous material distribution, can be moved outside the electrode area, for example by virtue of the coffee ring being obtained at the peripheral structure 16 which is arranged outside the electrode regions or the functional structure;
4. the ink or liquid can be delimited such that it does not flow into adjacent regions where it may be undesirable; and
5. due to the frame structure, multiple printing methods of different nanomaterials over the same region are made possible because it makes possible more degrees of freedom in the ink parameters, such as viscosity and surface tension.

Figure 10:
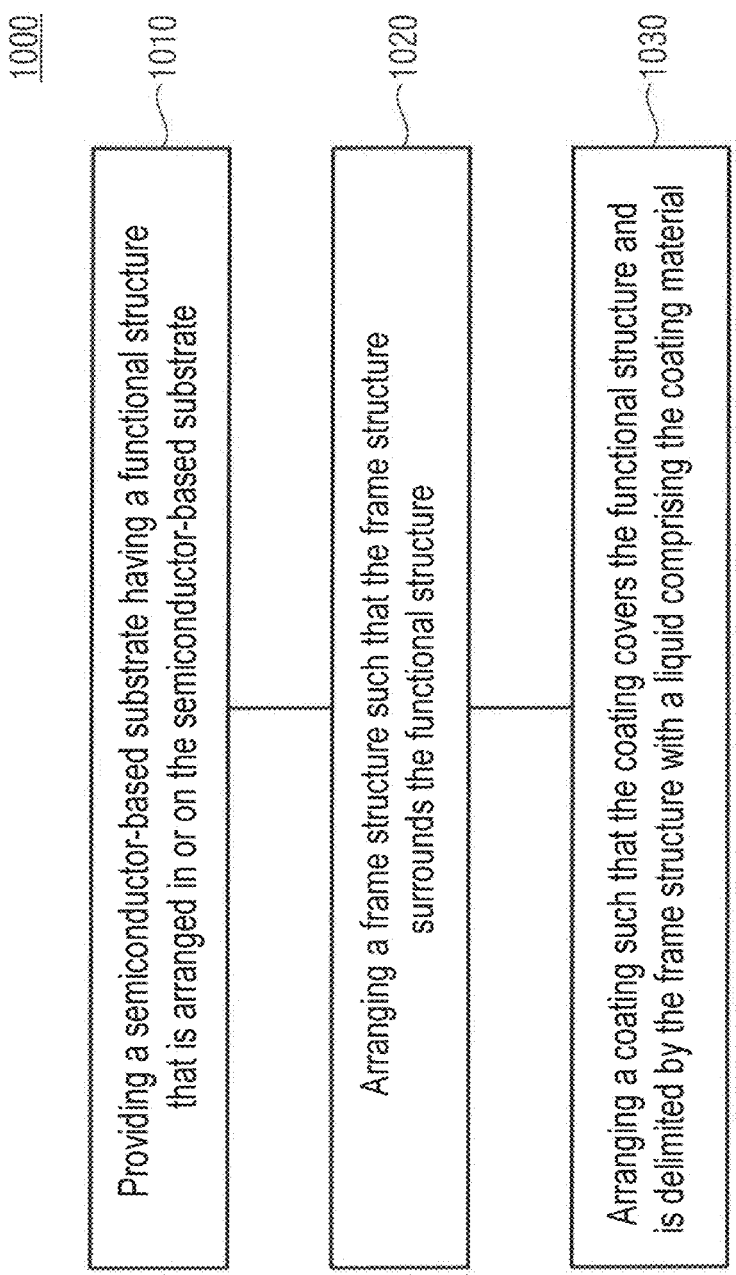
FIG. 10 shows a schematic flowchart of a method according to an exemplary embodiment.

FIG. 10 shows a schematic flowchart of a method 1000 according to an exemplary embodiment. The method 1000 comprises a step 1010 for providing a semiconductor-based substrate having a functional structure that is arranged in or on the semiconductor-based substrate, for example the functional structure 14 that is arranged on or in the semiconductor-based substrate 12. The method 1000 comprises a step 1020 for arranging a frame structure, such as the frame structure 16, such that the frame structure surrounds the functional structure. The method furthermore comprises a step 1030 for arranging a coating such that the coating covers the functional structure and is delimited by the frame structure. The coating can be the coating 22, for example. It should be pointed out at this point that the functional structure can be arranged before, after or during the production or provision of the frame structure. For example, the frame structure can be produced around the functional structure 14, for example by using a photolithographic process. Alternatively, the region 24 can also be defined before the functional structure 14 is arranged and the functional structure is arranged in the region 24. Alternatively or additionally, it is likewise possible to use a same process step to at least partially produce the functional structure 14 and to at least partially produce the frame structure 16.

Figure 11:
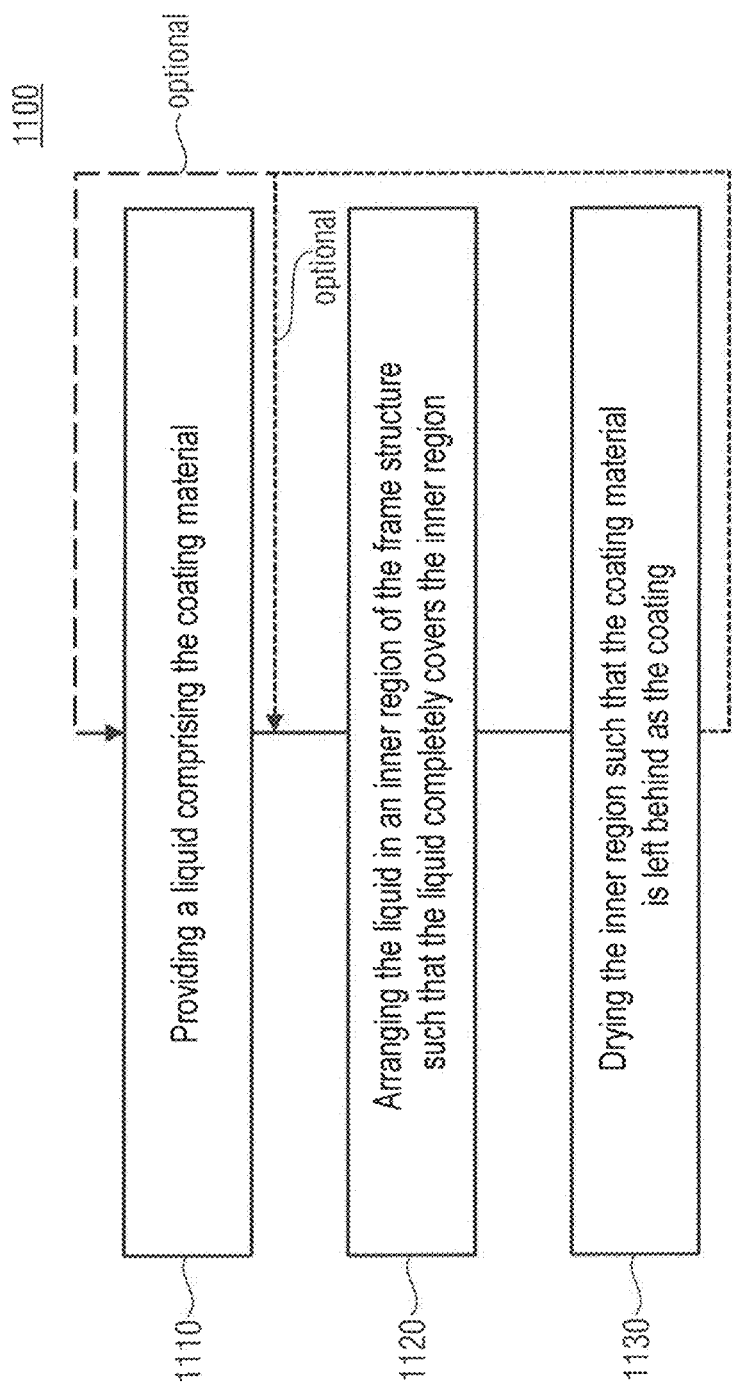
FIG. 11 shows a schematic flowchart of a method that can be performed for example to at least partially provide a coating in the method according to FIG. 10.

FIG. 11 shows a schematic flowchart of a method 1100 that can be performed for example to at least partially provide or arrange the coating in step 1030.

In a step 1110, a liquid comprising the coating material is provided. This can be for example nanomaterials dispersed in a solvent.

In a step 1120, the liquid is arranged in an inner region of the frame structure such that the liquid completely covers the inner region. The liquid can be arranged, for example, in the region 24. By using high-viscosity liquids, the frame structure can also have openings.

Step 1130 comprises drying the inner region such that the coating material is left behind as the coating. Optionally, preferably after drying 1130 and with another performance of steps 1120 and 1130, it is possible to arrange a further layer with the liquid, which can make possible for example a reduction or decrease in faults or air inclusions.

Likewise optionally, and as an alternative to the repetition of the steps 1120 and 1130, it is possible for the method 1100 to be repeated by performing the steps 1110, 1120 and 1130 again, for example by virtue of another liquid being provided in step 1110, which means that another layer in the coating can be obtained, as is described for example in connection with apparatus 10a. This can also be understood to mean that the method 1000 can be performed such that a second liquid is arranged in the inner region after the inner region is dried, wherein the second liquid has a second coating material. The inner region can be dried again, such that the second coating material forms a layer on the coating.

The exemplary embodiments described herein, in particular the method 1000 and/or 1100, can be performed such that the substrate comprises a semiconductor wafer, wherein the method is repeatedly performed on the wafer level, which means a plurality of frame structures are filled during a printing step.

Although some aspects were described in connection with an apparatus, it is to be understood that these aspects also represent a description of the corresponding method, which means that a block or a structural element of an apparatus should also be understood to be a corresponding method step or a feature of a method step. Analogously, aspects described in connection with a, or as a, method step, also represent a description of a corresponding block or detail or feature of a corresponding apparatus.

The above-described exemplary embodiments merely represent an illustration of the principles of the present invention. It is to be understood that modifications and variations of the arrangements and details described herein will be apparent to other persons skilled in the art. It is therefore intended that the invention be limited only by the scope of protection of the following patent claims and not by the specific details that were presented here with reference to the description and the explanation of the exemplary embodiments.

What is claimed is:

1. A method for producing a structure, the method comprising:
    providing a semiconductor-based substrate having a functional structure that is arranged in the semiconductor-based substrate;
    arranging a frame structure in the semiconductor-based substrate such that the frame structure laterally surrounds the functional structure in the semiconductor-based substrate; and
    arranging over the semiconductor-based substrate an ink coating having planar upper and lower surfaces such that the ink coating covers the functional structure and is delimited by the frame structure.

2. The method as claimed in claim 1, wherein arranging the ink coating comprises:
    providing a first liquid comprising a coating material;
    arranging the first liquid in an inner region of the frame structure such that the first liquid completely covers the inner region, the functional structure positioned under the inner region in the semiconductor-based substrate; and
    drying the inner region such that the coating material is left behind as the ink coating.

3. The method as claimed in claim 2, wherein arranging the ink coating further comprises:
    arranging a second liquid in the inner region on the coating material after the inner region has dried, wherein the second liquid comprises a second coating material; and
    drying the inner region again, such that the second coating material forms a second ink coating.

4. The method as claimed in claim 3, wherein the semiconductor-based substrate comprises a semiconductor wafer, and wherein arranging the ink coating is performed repeatedly on the semiconductor wafer to form the ink coating and the second ink coating.

5. A method, comprising:
forming a functional structure in or on a semiconductor-based substrate;
arranging a frame structure to surround the functional structure, wherein the frame structure comprises a first vertical sidewall and a second vertical sidewall; and
arranging a coating to cover the functional structure and to be delimited by the frame structure, wherein the coating comprises a carbon nanomaterial ink, wherein the coating comprises at least one first planar layer having a planar top surface and a planar bottom surface and one second planar layer having a planar bottom surface, and wherein the at least one first planar layer and one second player layer are laterally delimited by the first vertical sidewall and the second vertical sidewall.

6. The method as claimed in claim 5, wherein the coating completely covers an inner region of the frame structure.

7. The method as claimed in claim 5, wherein the coating comprises a homogeneous coating.

8. The method as claimed in claim 5, wherein the frame structure is arranged on a substrate side, and wherein the frame structure protrudes with respect to a substrate surface.

9. The method as claimed in claim 8, wherein the frame structure has a height of at least 10 nm and at most 1000 µm.

10. The method as claimed in claim 5, wherein the frame structure is arranged on a substrate side, and wherein the frame structure forms a trench in the substrate side.

11. The method as claimed in claim 10, wherein the frame structure has a depth of at least 10 nm and at most 1000 µm.

12. The method as claimed in claim 5, wherein the coating comprises a hydrophilic coating material and wherein the frame structure comprises a hydrophobic material.

13. The method as claimed in claim 5, wherein the coating comprises a hydrophobic coating material and in which the frame structure comprises a hydrophilic material.

14. The method as claimed in claim 5, wherein the frame structure comprises a frame width between an inner side of the frame structure and an outer side of the frame structure having a dimension of at least 10 nm and at most 10 mm.

15. The method as claimed in claim 5, wherein the frame structure comprises an electrically conductive frame structure.

16. The method as claimed in claim 5, wherein the frame structure comprises at least one first layer and one second layer.

17. The method as claimed in claim 5, wherein the functional structure comprises an electrode structure.

18. The method as claimed in claim 5, wherein the functional structure provides an electrically conductive function and/or a protective function against mechanical and/or chemical influences.

19. The method as claimed in claim 5, wherein the functional structure comprises a chemosensor or a transistor.

20. A method, comprising:
forming a functional structure in a semiconductor-based substrate;
arranging a frame structure in the semiconductor-based substrate to laterally surround the functional structure, wherein the frame structure includes a first vertical sidewall and a second vertical sidewall in the semiconductor-based substrate; and
arranging a coating on the semiconductor-based substrate to cover the functional structure, the coating comprising a first planar layer having a planar top surface and a planar bottom surface and a second planar layer having a planar top surface and a planar bottom surface, wherein the first planar layer and the second planar layer are both laterally delimited by the first and the second vertical sidewalls of the frame structure.

* * * * *